(12) United States Patent
Liu et al.

(10) Patent No.: US 6,942,926 B2
(45) Date of Patent: Sep. 13, 2005

(54) CURABLE COATINGS HAVING LOW PERMEABLE TO SULFUR-BEARING GASES

(75) Inventors: Xiaoqian Liu, Clifton Park, NY (US); Slawomir Rubinsztajn, Niskayuna, NY (US)

(73) Assignee: General Electric Company, Pittsfield, MA (US)

( * ) Notice: Subject to any disclaimer, the term of this patent is extended or adjusted under 35 U.S.C. 154(b) by 48 days.

(21) Appl. No.: 10/418,465

(22) Filed: Apr. 18, 2003

(65) Prior Publication Data

US 2004/0209089 A1 Oct. 21, 2004

(51) Int. Cl.$^7$ .................................................. B32B 9/04
(52) U.S. Cl. ........................ 428/447; 525/106; 525/479
(58) Field of Search ................................. 525/106, 479; 428/447; 427/387

(56) References Cited

U.S. PATENT DOCUMENTS

| | | | |
|---|---|---|---|
| 5,663,245 A | 9/1997 | Kennedy et al. | 525/479 |
| 5,728,768 A | 3/1998 | Saxena et al. | 524/506 |
| 5,856,392 A | 1/1999 | Kennedy et al. | 525/479 |
| 6,005,051 A * | 12/1999 | Kennedy et al. | 525/106 |
| 6,258,878 B1 * | 7/2001 | Bahadur et al. | 524/107 |

OTHER PUBLICATIONS

Wilczek et al., Journal of Macromolecular Science, Chemistry, A24(9), pp. 1033–1049.*

* cited by examiner

*Primary Examiner*—David J. Buttner
*Assistant Examiner*—Christopher Keehan
(74) *Attorney, Agent, or Firm*—Kenneth S. Wheelock

(57) ABSTRACT

Siloxane cross-linked polyolefins provide for a composition that is more or less impermeable to gaseous sulfur compounds such as hydrogen sulfide providing for a protective coating for various articles of manufacture especially electronic components and a method of protecting various articles of manufacture from the effects of such gaseous sulfur compounds.

2 Claims, No Drawings

US 6,942,926 B2

CURABLE COATINGS HAVING LOW PERMEABLE TO SULFUR-BEARING GASES

TECHNICAL FIELD

This invention relates generally to polymeric compositions, including two-component networks and multi-block copolymers, containing polyisobutylene useful as coatings. More particularly, the present invention relates to the synthesis of various novel compositions, including two-component networks and multi-block copolymers, containing polyisobutylene by linking a plurality of polyisobutylene polymer chains with siloxane compounds having at least two SiH moieties useful as coatings. Specifically, the two-component networks that are synthesized by linking multifunctional polyisobutylenes, preferably allyl-terminated polyisobutylenes, with multifunctional linear polysiloxanes, such as di-telechelic linear SiH-terminated polydimethylsiloxane, by hydrosilylation may be coated onto electronic devices. Similarly, multi-block copolymers may be synthesized by endlinking bi-functional allyl-terminated polyisobutylenes with bi-functional SiH-terminated linear polysiloxanes, such as polydimethylsiloxanes, by hydrosilylation. Still other polymeric networks comprising polyisobutylene may be synthesized by linking multifunctional polyisobutylenes, preferably di-telechelic allyl-terminated polyisobutylenes, with multifuntional SiH-containing compounds, preferably cyclosiloxanes such as hexamethylhexahydrocyclosiloxane, by hydrosilylation and used as a coating.

BACKGROUND OF THE INVENTION

With the discovery of living cationic polymerization, the synthesis of polyisobutylenes (PIBs) with controlled molecular weight and quantitative end functionality was made possible. Today, it is known that allyl-terminated polyisobutylenes can be quantitatively endlinked by hydrosilylation with molecules containing an SiH moiety. This reaction results in the formation of a hydrolytically stable Si—C bond. Heretofore, however, research into the usefulness of the quantitative end functionality of polyisobutylene and the ability of allyl-terminated PIBs to be endlinked via hydrosilylation with siloxane compounds has centered on the production of star polymers and star block copolymers. For instance, U.S. Pat. No. 5,663,245 teaches the synthesis and characterization of multi-arm star polymers comprising polyisobutylene arms emanating from a well-defined siloxane core. Star block copolymers have been produced using polyisobutylene-b-polystyrene arms emanating from a well-defined siloxane core. There has been little, if any, study into the usefulness of this synthesis reaction in the production of networks such as two-component networks or multi-block copolymers.

The polymeric networks of the present invention, and particularly two-component networks (BCNs), should be distinguished from more traditional interpenetrating polymer networks (IPNs). A BCN is defined as a single elastomeric network comprising two chemically different covalently bonded sequences; whereas, an IPN consists of two or more unlinked independent networks. The distinction to be made is significant in that the polymers in the IPNs are not linked chemically, but rather are two separate networks tangled within one another. Most two-component systems studied to date concern IPNs, with very few studies having been performed using BCNs.

It will be appreciated that multi-block copolymers are like BCNs in that they also comprise two chemically different covalently bonded sequences, but are not crosslinked in the manner that BCNs are crosslinked. Rather, multi-block copolymers are linear blocks of at least two polymers, such as, for the present invention, polyisobutylene (-A-) and any of a number of bi-functional linear polysiloxanes (-B-), endlinked together to form multiple block copolymers (-A-B-)n. Notably, these block copolymers are synthesized differently from "regular" block copolymers in that the polymers (-A-) and (-B-) are already formed before endlinking takes place. However, they are not "two-component networks" either, as defined hereinabove, because they are not crosslinked and, therefore, are not elastomeric in nature and are soluble in various solvents. BCNs traditionally have required that the two crosslinked components at least contribute theoretically to the physical and chemical characteristics of the polymeric networks. That is, the properties of the two-component network will reflect those of the individual components. For example, two-component networks containing polyisobutylenes and polysiloxanes may be of great interest to the extent that polyisobutylene is known for low cost, superior mechanical properties, extremely low gas permeability and excellent environmental, hydrolytic and high temperature resistance while, in contrast, siloxanes are relatively expensive, have poor mechanical properties, but excel in regard to high gas permeability, low surface energy and bi-compatibility.

SUMMARY OF THE INVENTION

The present invention provides for a polymeric composition of at least two chemically different components covalently bonded together said composition useful as a coating. The present invention also provides for a two-component network or a multi-block copolymer of well-defined structure containing a multifunctional polyisobutylene and a linear polysiloxane such as polydimethylsiloxane that is useful as a coating. The present invention further provides for a polymeric composition which is elastomeric and, therefore, insoluble in solvents. The present invention additionally provides for a method for the synthesis of a two-component network, as above, by endlinking a di-functional allyl-terminated polyisobutylene with multi-functional SiH-terminated polydimethylsiloxane by hydrosilylation. The present invention additionally provides for a method for the synthesis of a multi-block copolymer, as above, by endlinking a di-functional allyl-terminated polyisobutylene with di-functional SiH-terminated polydimethylsiloxane by hydrosilylation. The present invention additionally provides for a method for the synthesis of a polyisobutylene network, as above, by endlinking a di-telechelic allyl-terminated polyisobutylene (or other allyl terminated polyolefin) with a SiH-containing compound such as hexamethylhexahydro-cyclosiloxane by hydrosilylation and using the resulting composition as a coating. At least one or more of the foregoing objects, together with the advantages thereof over the known art relating to polymeric networks and multi-block copolymers, which shall become apparent from the specification which follows, are accomplished by the invention as hereinafter described. In general, the present invention provides a composition comprising the hydrosilylation reaction product of a plurality of multi-functional, allyl-ended polyisobutylenes linked to a plurality of multi-functional siloxane compounds having at least two SiH moieties. The present invention also provides a two-component network comprising the hydrosilylation reaction product of a plurality of multi-functional, allyl-terminated polyisobutylenes endlinked by a plurality of di-telechelic, linear polysiloxanes having at least two SiH moieties, the two-component network having its chemical and physical properties determined by both the polyisobutylenes and the polysiloxanes. The present invention further provides a multi-block copolymer comprising the hydrosilylation reaction product of a plurality of ditelechelic, allyl-terminated polyisobutylenes endlinked to a plurality of ditelechelic, linear polysiloxanes having up to two SiH moieties, the multi-block copolymer having its chemical and physical properties determined by both the polyisobutylenes and the polysiloxanes. Still further, the present invention provides a polymeric network comprising the hydrosilylation reaction product of a plurality of multi-functional, allyl-terminated polyisobutylenes linked to a plurality of multi-functional siloxane compounds having at least two SiH moieties. Still other objects and aspects of the present invention may be achieved by a method for synthesizing a polymeric network composition comprising linking a plurality of multi-functional, allyl-terminated polyisobutylenes with a plurality of siloxane compounds having at least two SiH moieties by hydrosilylation said polymeric network useful as a coating.

The present invention provides for a coating comprising a polymeric composition that comprises the reaction product of a polyolefin and a siloxane or polysiloxane wherein said coating has a low diffusion coefficient for hydrogen sulfide at 50° C. or alternatively a low diffusion coefficient for methyl mercaptan at 50° C. or a low diffusion coefficient for both.

DETAILED DESCRIPTION OF THE INVENTION

The present invention is first directed toward the synthesis of polymeric compositions, including two-component networks and multi-block copolymers, containing multifunctional polyisobutylenes and multifunctional compounds having one or more SiH moieties. More particularly, the present invention seeks to take advantage of the known hydrosilylation reaction to endlink allyl-terminated polyisobutylenes and molecules, such as siloxanes, containing an SiH moiety so as to provide new useful polymeric compositions containing polyisobutylene or other polyolefins. It will be appreciated that for purposes of this invention, "polymeric compositions" refers to those compositions which comprise two chemically different covalently bonded sequences, such as for example, polyisobutylene and polysiloxane, and includes two-component networks, multi-block copolymers, and other related networks as set forth herein.

Two-component networks having well-defined polyisobutylenes can be synthesized by endlinking a multi-functional, allyl-terminated polyisobutylene with a well-defined di-functional, SiH terminated linear polysiloxane by hydrosilylation. These BCNs of the present invention are elastomeric and insoluble in solvents, and are believed to have significant ramifications in the elastomeric rubber industry.

In a similar manner, multi-block copolymers having well-defined polyisobutylenes and siloxanes can be synthesized by endlinking a di-functional, allyl-terminated polyisobutylene with a di-functional, SiH terminated linear polysiloxane by hydrosilylation. Where PIB and PDMS are utilized, the reaction scheme would produce multi-block PIB/PDMS copolymers, as set forth in the scheme hereinbelow. Still further, it will be appreciated that, where the amount of polyisobutylene simply overwhelms the amount of SiH moiety-containing molecules in the new composition, new polyisobutylene networks are synthesized. These polyisobutylene networks contain multifunctional, and preferably di-telechelic, allyl-terminated polyisobutylenes and SiH-containing siloxane compound. More preferably, the polyisobutylene networks are synthesized by endlinking a di-telechelic allyl-terminated polyisobutylene with linear or cyclic hydrido-siloxanes or hydrosilanes by hydrosilylation. Such linear or cyclic hydrido-siloxanes or hydrosilanes are well known in the art.

In fact, polyisobutylene networks with well-defined structure have been synthesized by endlinking di-telechelic polyisobutylenes having a known number average molecular weight (Mn) with a SiH containing cyclosiloxane compound of suitable functionality, namely hexamethylhexahydrocylosiloxane, most notably, the hydrosilylation reaction with di-telechelic PIBs.

It will be appreciated that the di-telechelic PIBs and siloxane components are linked. Accordingly, it is possible that, if the siloxane component becomes of sufficient molecular weight and size, the network could form a two-component network. It is possible that a cyclosiloxane component other than low molecular weight cyclic siloxanes (usually volatile), and if the siloxane component becomes of sufficient molecular weight and size, a network-like structure could form that would only swell instead of dissolving in solvents. To synthesize the polymeric compositions, multi-telechelic, allyl-ended polyisobutylene is initially synthesized as known in the art. The allyl-ended PIBs may be prepared by living polymerization of isobutylene to practically any lengths (and, therefore, to practically any desired molecular weight) followed by quantitative end-functionalization to a terminal olefinic group. Living isobutylene polymerization can be induced to obtain chlorine terminated polyisobutylenes by the use of a 2-chloro-2,4,4-trimethylpentane/TiCl4 initiating system in the presence of N,N-dimethylacetamide as the electron pair donor. A more detailed description of this procedure is set forth in "Electron Pair Donors in Carbocationic Polymerization, III. Carbonation Stabilization by External Electron Pair Donors in Isobutylene Polymerization" Kaszas et al., J. Macromol. Sci., Chem., A26, 1099–1114(1989). After completion of the polymerizations, allylation of the living polyisobutylenes may be achieved by quenching in situ with an excess of allyltrimethylsilane, to provide the allyl-terminated PIBs. A more detailed description of this procedure is set forth in "Electrophilic Substitution of Organosilicon Compounds II., Synthesis of Allyl-terminated Polyisobutylenes by Quantitative Alkylation of tert-Chloro-Polyisobutylenes with Allyltrimethylsilane", Wilczek et al., J. Polym. Sci.: Polym. Chem. 25, 3255–3265 (1987. The resultant allyl-terminated PIBs may then be characterized by H-NMR spectroscopy, gel permeation chromatography (GPC), and differential scanning calorimetry (DSC).

The compositions of the present invention are more fully described in U.S. Pat. No. 6,005,051 herewith and hereby specifically incorporated by reference.

Siloxane polymers may be prepared separately from the preparation of polyisobutylene. For example, di-functional SiH-terminated polydimethylsiloxanes can be synthesized by acid-catalyzed equilibration of the cyclic tetramer, D4, in the presence of the corresponding chain stopper, tetramethyldisiloxane. The polysiloxanes can then be characterized by H-NMR spectroscopy and DSC. Where a cyclosiloxane is desired such as hexahydrohexamethylcyclohexasiloxane, it can be prepared by the hydrolysis of methyldichlorosilane, as is well known in the art and as is more particularly described in U.S. Pat. No. 3,484,468, the disclosure of which is incorporated by reference. As used herein the term siloxane includes monomeric or polymeric siloxane species containing one or more reactive moieties that would reactively condense with the olefinic terminations of di-telechelic polyolefins. This usually means the siloxane moieties will possess one or more, preferably two or more, silicon bonded hydrogen atoms, e.g. silyl hydrides or hydrido-siloxanes having the general formula:

$$M_a M^H_b D_c D^H_d T_e T^H_f Q_g$$

where the various silicone building blocks, M, D, T, and Q have the usual definitions:

$M = R^1 R^2 R^3 SiO_{1/2}$;

$M^H = HR^4 R^5 SiO_{1/2}$;

$D = R^6 R^7 SiO_{2/2}$;

$D^H = HR^8 SiO_{2/2}$;

$T = R^9 SiO_{3/2}$;

$T^H = HSiO_{3/2}$; and $Q = SiO_{4/2}$; where $R^1$, $R^2$, $R^3$, $R^4$, $R^5$, $R^6$, $R^7$, $R^8$ and $R^9$ are each independently selected from the group consisting of one to sixty carbon atom monovalent hydrocarbon radicals and one to sixty carbon atom monovalent organic radicals where the subscripts a, b, c, d, e, f, and g are zero or positive integers subject to the requirement that b+d+f≧1, preferably b+d+f≧2, more preferably b+d+f≧3, and most preferably b+d+f≧4. The phrase one to sixty carbon atom monovalent organic radicals means any organic radical where the carbon-carbon chain is interrupted by a hetero-atom selected from the group consisting of oxygen, sulfur, nitrogen and phosphorus. As used herein the term siloxane is a broadly inclusive term and includes functionalized and reactive siloxanes.

Because the di-telechelic polyolefins utilized in the coatings of the present invention are reactive, they may be reacted to form terminal oxirane groups, i.e. terminal epoxide groups, and polymerized or cross-linked by the previously described hydrido-siloxanes, e.g. $M_a M^H_b D_c D^H_d T_e T^H_f Q_g$.

Similarly the terminal olefinic groups may be oxidized to form terminal carboxylic acid groups. These could then be condensed with silanol containing species, e.g. $M_a M^{OH}_b D_c D^{OH}_d T_e T^{OH}_f Q_g$, where the standard structural definitions would be modified as follows:

$M = R^1 R^2 R^3 SiO_{1/2}$;

$M^{OH} = HOR^4 R^5 SiO_{1/2}$;

$D = R^6 R^7 SiO_{2/2}$;

$D^{OH} = HOR^8 SiO_{2/2}$;

$T = R^9 SiO_{3/2}$;

$T^{OH} = HOSiO_{3/2}$; and $Q = SiO_{4/2}$;

where $R^1$, $R^2$, $R^3$, $R^4$, $R^5$, $R^6$, $R^7$, $R^8$ and $R^9$ are each independently selected the group consisting of hydroxyl, one to sixty carbon atom monovalent hydrocarbon radicals and one to sixty carbon atom monovalent organic radicals where the subscripts a, b, c, d, e, f, and g are zero or positive integers subject to the requirement that b+d+f≧1, preferably b+d+f≧2, more preferably b+d+f>3, and most preferably b+d+f≧4. The phrase one to sixty carbon atom monovalent organic radicals means any organic radical where the carbon-carbon chain is interrupted by a hetero-atom selected from the group consisting of oxygen, sulfur, nitrogen and phosphorus.

The coatings of the present invention may prepared by reacting a di-telechelic polyolefin, preferably polyisobutylene under hydrosilylation conditions with a suitably cross linking hydrido-siloxane. Hydrosilylation is catalyzed by noble metals, preferably platinum and many useful formulations of such catalysts have been disclosed. Many types of noble metal catalysts for this hydrosilylation reaction are known and such catalysts may be used for the reaction in the present instance. When optical clarity is required the preferred catalysts are catalysts that are soluble in the reaction mixture. By noble metal, Applicants define Ru, Rh, Pd, Os, Ir, and Pt as noble metals and also include Ni in the definition because of its known hydrogenation activity. Preferably the catalyst is a platinum compound and the platinum compound can be selected from those having the formula (PtCl$_2$Olefin), H(PtCl$_3$Olefin) as described in U.S. Pat. No. 3,159,601, hereby incorporated by reference or H$_2$PtCl$_6$. The olefin shown in the previous two formulas can be almost any type of olefin but is preferably an alkenylene having from 2 to 8 carbon atoms, a cycloalkenylene have from 5 to 7 carbon atoms or styrene. Specific olefins utilizable in the above formulas are ethylene, propylene, the various isomers of butylene, octylene, cyclopentene, cyclohexene, cycloheptene, and the like.

A further platinum containing material usable in the compositions of the present invention is the cyclopropane complex of platinum chloride described in U.S. Pat. No. 3,159,662 hereby incorporated by reference.

Further the platinum containing material can be a complex formed from chloroplatinic acid with up to 2 moles per gram of platinum of a member selected from the class consisting of alcohols, ethers, aldehydes and mixtures of the above as described in U.S. Pat. No. 3,220,972 hereby incorporated by reference.

The catalyst preferred for use with liquid injection molding compositions are described in U.S. Pat. Nos. 3,715,334; 3,775,452; and 3,814,730 to Karstedt. Additional background concerning the art may be found at J. L. Spier, "Homogeneous Catalysis of Hydrosilation by Transition Metals, in *Advances in Organometallic Chemistry*, volume 17, pages 407 through 447, F. G. A. Stone and R. West editors, published by the Academic Press (New York, 1979). Persons skilled in the art can easily determine an effective amount of platinum catalyst. Generally, an effective amount for hydrosilylation ranges from about 0.1 to 50 parts per million of the total organopolysiloxane composition and all sub-ranges there between.

The di-telechelic polyolefins utilized by the coatings of the present invention may alternatively be reacted to form epoxidized terminal olefinic groups and the epoxidized di-telechelic olefins reacted under conditions of acid catalysis with hydrido-siloxanes to form cross-polymers that may be utilized as the coatings of the present invention.

In order to obtain high tensile strength in the compositions of the present invention, it may be desirable to incorporate a filler into the composition. Examples of the many fillers that may be chosen are titanium dioxide, lithopone, zinc oxide, zirconium silicate, silica aerogel, iron oxide, diatomaceous earth, calcium carbonate, fumed silica, silazane treated silica, precipitated silica, glass fibers, magnesium oxide, chromic oxide, zirconium oxide, aluminum oxide, alpha quartz, calcined clay, asbestos, carbon, graphite, cork, cotton, synthetic fibers, and the like.

The preferred fillers that should be utilized in the composition of the present invention are either a fumed silica or a precipitated silica that has been surface treated. In one method of surface treatment, the fumed silica or precipitated silica is exposed to cyclic organopolysiloxanes under heat and pressure. An additional method of treating fillers is one in which the silica is exposed to siloxanes or silanes in the presence of an amine compound.

A particularly preferred method of surface treating silica fillers employs methyl silane silazane surface treating agents. Methylsilane or silazane surface treated fumed or precipitated silica fillers exhibit the property of flowing easily and also do not increase the low viscosity of the uncured liquid precursor silicone composition. After curing, silazane treated silicas impart an improved tear strength to the cured elastomer. Silazanes treatments are disclosed in U.S. Pat. Nos. 3,635,743 and 3,847,848 hereby incorporated by reference.

The filler is generally utilized in a concentration of from about 5 to about 70 parts, preferably 15 to 50 parts filler for each 100 parts by weight of the resulting cross-linked or network polymer. The preferred filler is silazane treated fumed silica or mixtures of silazane treated fumed silica with silazane treated precipitated silica. This latter mixture is particularly preferred containing a weight ratio of fumed silica to precipitated silica of about 25/1 to about 1/1 and preferably from about 10/1 to about 5/1.

Hydroxy containing organopolysiloxane fluid may be added to extend the shelf life of the cross-linkable organopolysiloxane composition. Where silazane treated precipitated silica filler is present in the composition, the hydroxy containing organopolysiloxane fluid or resin may be added in conjunction with the precipitated silica filler to obtain extended shelf life and mold release. Suitable hydroxy containing organopolysiloxane fluid has a viscosity of from about 5 to about 100 centipoise at 25° C. and preferably from about 20 to 50 centipoise. These fluids may be represented by the formula:

$$R_j(OH)_k SiO_{(4-j-k)/2}$$

where R is a monovalent hydrocarbon radical having from one to forty carbon atoms, j may range from 0 to about 3, preferably 0.5 to about 2.0, k ranges from 0.005 to about 2, and the sum of j and k ranges from about 0.8 to about 3.0. The hydroxy substitution on the organopolysiloxane fluid or resin is primarily a terminal hydroxy substitution.

When it is desired to form the cured composition, the two components, PIB and siloxane prepolymers, are mixed into each other in the presence of a noble metal hydrosilylation catalyst any desired inhibitors and the composition is cured. Depending upon the inhibitor chosen the composition may be cured by the application of heat.

Once the desired PIB and siloxane prepolymers were formed, the allyl-terminated PIB precursors can be linked to the well-defined siloxanes containing a desirable number of SiH functions by hydrosilylation. In doing so, the polyisobutylene can be dissolved in toluene (30% wt, PIB), and 1-ethynyl-1-cyclohexanol (Aldrich) may be added to retard or inhibit hydrosilylation, if desired. It has been found that using an inhibitor significantly decreases the amount of cure shrinkage. Further inhibitors may allow the controlled initiation of the reaction between the allyl moiety and the hydro-silyl moiety as taught in U.S. Pat. Nos. 5,506,289; 5,922,795; 5,928,564; 5,948,339; 6,002,039; 6,015,853 and 6,034,199 hereby and herewith incorporated by reference in their entirety. 500 ppm of a $H_2PtCl_6$ catalyst solution is then added and the solution is mixed, poured into a Teflon mold, covered and placed in an oven at about 60° C. for about 48 hours and about 90° C. for about 24 hours. The network samples may then be removed from the oven.

To confirm hydrosilylation efficiency, the amount of extractables (sol fraction) can be determined post cure. The network samples are weighed, extracted (i.e., immersed in toluene which was decanted and replaced about every 8 hours) at room temperature for about 48 to about 72 hours, and de-swelled with a series of toluene/methanol mixtures. The concentration of the toluene/methanol mixture can be changed in 10% increments about every 12 to 24 hours, starting with the ratio of toluene to methanol equal to about 90 to 10, and ending with 100% methanol. The network samples may then be removed from the solvent and dried in a vacuum oven at about 60° C. to constant weight over about 3 days. The amount of sol can be obtained from the weight difference of the networks samples before and after extraction.

The compositions of the present invention are useful as coatings to make vapor or gas impermeable barriers that are impermeable to sulfur containing species. Thus the compositions of the present invention provide a method of making a coated article wherein said coated article is resistant to the effects of certain corrosive gases or vapors, e.g. sulfur bearing gases such as hydrogen sulfide, methyl mercaptan, sulfur dioxide, sulfur trioxide. Such a coating process or method produces a laminate comprising the coatings of the present invention and a substrate said substrate being the article it is desired to protect, e.g. an electronic device, circuit board, or chip. Because the coatings of the present invention are particularly resistant or impermeable to sulfur bearing gases, they are particularly well suited to protecting electronic components in automobiles where the silver employed in the electronic circuits of the electronic components would ordinarily be reactive and tarnish or corrode.

The word impermeable may have several variable meanings that are defined by use. As used herein the word impermeable means showing no measurable signs of tarnish or corrosion after a two-day exposure to 50 ppm (vapor parts per million or parts per million, ppm) of a sulfur bearing specie such as hydrogen sulfide or methyl mercaptan at 50° C. or higher.

It will be appreciated that the foregoing procedure results in the synthesis of multi-component polymeric compositions containing polyisobutylene. However, other olefins, e.g. methyl pentene, propylene, can be polymerized in a fashion that produces allyl or olefinic end groups. These materials can also be cross-linked by hydrosilylation to produce polymeric compositions that are analogous to those derived from polyisobutylene. In order to demonstrate practice of the invention, the following experiments were carried out. The following are illustrative of the nature of the invention only, but should not be construed as limiting the scope of the invention. The scope of the invention resides in the invention as hereinafter claimed.

Experimental
  Procedure to make test membranes or films
Silicone-based coating (solvent-free):
  1. A clean glass surface was sprayed with mold release
  2. The coating material was poured or dropped using a pipet onto the glass in a line shape
  3. The line of coating material was drawn down using a drawing bar, which was set at the desired thickness which varied between 10–20 mil.
  4. The glass was placed in a 150° C. oven for 15 min
  5. The glass was then taken out of the oven and allowed to cool to room temperature
  6. The cured coating was carefully peeled off the glass and cut to a square 5"×5"
PIB-based coating (with ISOPAR C as solvent, bp ~100° C.)
Procedure 1, 2, 3 same as above for the silicone based coating:
  4. The glass was placed in a 100° C. oven for 1 hour
  5. The glass was taken out of the oven and allowed to cool to room temperature
  6. The cured coating was carefully peeled off the glass and cut to 5"×5"
Permeation Test Procedure;
  The film to be tested is cut to fit-in the permeation Cell. The cell has a lower chamber where the challenge gas ($H_2S$ or Methyl Mercaptan in Nitrogen) is introduced and an upper chamber for sampling. As the challenge permeates through the membrane, from the bottom portion of the cell to the top, it is picked up by the sweep gas and carried to the detector for quantitative analysis. The cell has inlet and outlet ports to allow for a continuous sweep of challenge and sampling gasses at ambient pressures.

Permeation Testing Procedure;

The film to be tested is cut to fit covering the lower chamber of a 2-part permeation cell. The lower chamber has an inlet and outlet passage way so that the challenge gas flows through the chamber freely without the result of backpressure. The challenge gas is a mixture of 50 ppm $H_2S$ or methyl mercaptan in nitrogen.

There is a groove cut into the face of the lower chamber. The groove contains an "O" ring. As the top chamber is placed on the lower chamber, the film, which covers the lower chamber and overlaps the "O" ring, makes a seal. The upper chamber is held in place with a pressure device.

The upper chamber also has an inlet and outlet passage. Nitrogen is purged through this passage at a rate of 45 cc/min. As the challenge ($H_2S$ or methyl mercaptan) permeates through the film it is swept to the detector by the nitrogen purge.

When analyzing for $H_2S$ the purge gas is drawn into an analyzer designed specifically for $H_2S$ detection at low levels. (Jerome-X631–0101 Gold Film Hydrogen Sulfide Analyzer made by Arizona Instrument)

When analyzing for methyl mercaptan the purge gas is drawn into a gas injection device where it is introduced to a Gas Chromatogram containing a PID for quantitative measurement.

There are several ASTM methods that address permeation of liquids or gasses through barriers, but none specific for this application. A reference method used is ASTM F739.

A liquid from a circulating bath is pumped through channels in the Cell to allow for cooling or heating of the Cell.

Test Conditions

| Cell Temperature: | 50° C. |
|---|---|
| Challenge Concentration: | 50 ppm vol. |
| Total flow: | 45 cc/min |

| Silicone membrane - hydrogen sulfide diffusivity | | |
|---|---|---|
| Cell #1 14 ± 2 mil Thickness Challenge: 50 ppm $H_2S$ Temp: 50° C. | | |
| Retention Time (minutes) | Amount (ppm) | Amount g/m²-day |
| Start | | |
| 0 | 0.00 | 0.0000 |
| 2 | 0.43 | 0.0085 |
| 38 | 1.60 | 0.0315 |
| 99 | 1.70 | 0.0335 |
| 841 | 1.40 | 0.0276 |
| 901 | 1.70 | 0.0335 |
| 962 | 1.30 | 0.0256 |
| 1022 | 1.20 | 0.0237 |
| 1088 | 1.50 | 0.0296 |
| 1156 | 1.50 | 0.0296 |

-continued

Silicone membrane - hydrogen sulfide diffusivity

| 1277 | 1.70 | 0.0335 |
| 1337 | 1.80 | 0.0355 |
| 1440 | 1.60 | 0.0315 |

Cell #2 14 ± 2 mil Thickness
Challenge: 50 ppm $H_2S$
Temp: 50° C.

| Retention Time (minutes) | Amount (ppm) | Amount $g/m^2$-day |
|---|---|---|
| 0 | 0.00 | 0.0000 |
| 5 | 3.90 | 0.0769 |
| 68 | 3.70 | 0.0729 |
| 119 | 3.80 | 0.0749 |
| 871 | 3.70 | 0.0729 |
| 931 | 3.30 | 0.0650 |
| 1110 | 3.20 | 0.0631 |
| 1176 | 2.60 | 0.0531 |
| 1237 | 3.60 | 0.0710 |
| 1298 | 3.60 | 0.0710 |
| 1470 | 3.60 | 0.0710 |

Silicone membrane - methyl mercaptan diffusivity

Cell #1 14 ± 2 mil Thickness
Challenge: 50 ppm $CH_3SH$
Temp: 50° C.

| Retention Time (minutes) | Amount (ppm) | Amount $g/m^2$-day |
|---|---|---|
| Start | | |
| 0 | 0.00 | 0.0000 |
| 1 | 0.00 | 0.0000 |
| 2 | 0.02 | 0.0006 |
| 4 | 0.06 | 0.0017 |
| 8 | 0.76 | 0.0210 |
| 16 | 1.30 | 0.0360 |
| 63 | 1.41 | 0.0390 |
| 124 | 1.37 | 0.0379 |
| 140 | 1.53 | 0.0423 |
| 184 | 1.31 | 0.0362 |
| 199 | 1.42 | 0.0393 |
| 244 | 1.33 | 0.0368 |
| 259 | 1.41 | 0.0390 |

Cell #2 14 ± 2 mil Thickness
Challenge: 50 ppm $CH_3SH$
Temp: 50° C.

| Retention Time (minutes) | Amount (ppm) | Amount $g/m^2$-day |
|---|---|---|
| 0 | 0.00 | 0.0000 |
| 4 | 0.06 | 0.0017 |
| 12 | 2.23 | 0.0617 |
| 34 | 2.65 | 0.0733 |
| 49 | 2.45 | 0.0678 |
| 94 | 2.60 | 0.0719 |
| 154 | 2.52 | 0.0697 |
| 214 | 2.51 | 0.0694 |
| 229 | 2.49 | 0.0689 |

Polyolefin (polyisobutylene) siloxane membrane - hydrogen sulfide diffusivity Cell #1 16 ± 2 mil Thickness
Challenge: 50 ppm $H_2S$
Temp: 50° C.

| Retention Time (minutes) | Amount (ppm) | Amount $g/m^2$-day |
|---|---|---|
| 0 | 0.000 | 0.0000 |
| 60 | 0.001 | 0.0000 |
| 210 | 0.000 | 0.0000 |
| 1800 | 0.000 | 0.0000 |
| 1980 | 0.002 | 0.0000 |
| 2460 | 0.003 | 0.0001 |
| 2580 | 0.003 | 0.0001 |
| 2820 | 0.004 | 0.0001 |
| 3090 | 0.005 | 0.0001 |
| 3180 | 0.006 | 0.0001 |
| 4620 | 0.013 | 0.0003 |
| 5580 | 0.014 | 0.0003 |
| 5760 | 0.014 | 0.0003 |

Cell #2 16 ± 2 mil Thickness
Challenge: 50 ppm $H_2S$
Temp: 50° C.

| Retention Time (hours) | Amount (ppm) | Amount $g/m^2$-day |
|---|---|---|
| 0 | 0.000 | 0.0000 |
| 30 | 0.000 | 0.0000 |
| 180 | 0.000 | 0.0000 |
| 1500 | 0.000 | 0.0000 |
| 2010 | 0.003 | 0.0001 |
| 2490 | 0.004 | 0.0001 |
| 2610 | 0.004 | 0.0001 |
| 2880 | 0.007 | 0.0001 |
| 3120 | 0.008 | 0.0002 |
| 3210 | 0.009 | 0.0002 |
| 4650 | 0.015 | 0.0003 |
| 5610 | 0.016 | 0.0003 |
| 5760 | 0.016 | 0.0003 |

Polyolefin (polyisobutylene) siloxane membrane - methyl mercaptan diffusivity Cell #1 15 ± 2 mil Thickness
Challenge: 50 ppm $CH_3SH$
Temp: 50° C.

| Retention Time (minutes) | Amount (ppm) | Amount $g/m^2$-day |
|---|---|---|
| 0 | 0.00 | 0.0000 |
| 60 | 0.00 | 0.0000 |
| 210 | 0.00 | 0.0000 |
| 1800 | 0.00 | 0.0000 |
| 1980 | 0.00 | 0.0000 |
| 2460 | 0.00 | 0.0000 |
| 2580 | 0.00 | 0.0000 |
| 2820 | 0.00 | 0.0000 |
| 3090 | 0.00 | 0.0000 |
| 3180 | 0.00 | 0.0000 |

-continued

Polyolefin (polyisobutylene) siloxane membrane - methyl mercaptan diffusivity

| | | |
|---|---|---|
| 4620 | 0.00 | 0.0000 |
| 5580 | 0.00 | 0.0000 |
| 5760 | 0.00 | 0.0000 |

Cell #2 15 ± 2 mil Thickness
Challenge: 50 ppm CH$_3$SH
Temp: 50° C.

| Retention Time (minutes) | Amount (ppm) | Amount g/m$^2$-day |
|---|---|---|
| 0 | 0.00 | 0.0000 |
| 30 | 0.00 | 0.0000 |
| 180 | 0.00 | 0.0000 |
| 1500 | 0.00 | 0.0000 |
| 2010 | 0.00 | 0.0000 |
| 2490 | 0.00 | 0.0000 |
| 2610 | 0.00 | 0.0000 |
| 2880 | 0.00 | 0.0000 |
| 3120 | 0.00 | 0.0000 |
| 3210 | 0.00 | 0.0000 |
| 4650 | 0.00 | 0.0000 |
| 5610 | 0.00 | 0.0000 |
| 5760 | 0.00 | 0.0000 |

These results demonstrate that membranes or films having a thickness varying from about 10 mils to about 30 mils thick possess hydrogen sulfide permeation values or diffusion rates of about 0.0003 grams of hydrogen sulfide per square meter of membrane per day. These results also indicate that the films are more resistant to the transport of methyl mercaptan, essentially no methyl mercaptan crossing the membrane within a four day test period (96 hours). Useful permeation rates are about 0.0010 grams or less of hydrogen sulfide per square meter of membrane per day, preferably a permeation rate about 0.0007 grams or less of hydrogen sulfide per square meter of membrane per day, more preferably a permeation rate about 0.0005 grams or less of hydrogen sulfide per square meter of membrane per day, and most preferably a permeation rate about 0.0003 grams or less of hydrogen sulfide per square meter of membrane per day at 50° C. Useful permeation rates are about 0.0010 grams or less of methyl mercaptan per square meter of membrane per day, preferably a permeation rate about 0.0007 grams or less of methyl mercaptan per square meter of membrane per day, more preferably a permeation rate about 0.0005 grams or less of methyl mercaptan per square meter of membrane per day, and most preferably a permeation rate about 0.0003 grams or less of methyl mercaptan per square meter of membrane per day at 50° C. These permeation rates may be used either singly or in combination to define the preferred operating parameters.

That which is claimed is:

1. A coating composition comprising a polymeric composition comprising the reaction product of:

a) a telechelic polymethylpentene and b) a siloxane whereby the diffusion rate of hydrogen sulfide gas through a membrane comprising said composition having a thickness ranging from about 10 to about 30 mil at 50° C. is below about 0.0010 grams of hydrogen sulfide per square meter of membrane per day.

2. A coated article comprising a coating comprising a polymeric composition comprising the reaction product of:

a) a telechelic polymethylpentene and b) a siloxane whereby the diffusion rate of hydrogen sulfide gas through a membrane comprising said composition having a thickness ranging from about 10 to about 30 mil at 50° C. is below about 0.0010 grams of hydrogen sulfide per square meter of membrane per day.

* * * * *